United States Patent [19]

Davis

[11] Patent Number: 4,961,010

[45] Date of Patent: Oct. 2, 1990

[54] OUTPUT BUFFER FOR REDUCING SWITCHING INDUCED NOISE

[75] Inventor: Jeffrey B. Davis, Raymond, Me.

[73] Assignee: National Semiconductor Corporation, Santa Clara, Calif.

[21] Appl. No.: 355,509

[22] Filed: May 19, 1989

[51] Int. Cl.$^5$ .................. H03K 17/16; H03K 19/094; H03K 5/12

[52] U.S. Cl. .................................. 307/443; 307/451; 307/542; 307/547; 307/548; 307/572; 307/263; 307/596

[58] Field of Search ............... 307/443, 448, 451, 542, 307/547, 548, 572, 263, 594–596, 296.4–296.5

[56] References Cited

U.S. PATENT DOCUMENTS

| | | | |
|---|---|---|---|
| 4,638,187 | 1/1987 | Boler et al. | 307/443 |
| 4,731,533 | 3/1988 | Van Lehn et al. | 307/443 |
| 4,771,195 | 9/1988 | Stein | 307/443 |
| 4,789,796 | 12/1988 | Foss | 307/443 |

OTHER PUBLICATIONS

"Minimization of Ground Bounce through Output Edge-Rate Control", Bernie New, Advanced Micro Devices, Inc., 3/88.

Primary Examiner—Stanley D. Miller
Assistant Examiner—Margaret Rose Wambach
Attorney, Agent, or Firm—Lee Patch; Daniel H. Kane

[57] ABSTRACT

An output buffer for reducing switching induced noise in high speed integrated circuit devices incorporates a relatively small current carrying capacity secondary pulldown transistor element with the current path first and second terminal leads coupled in parallel with the current path first and second terminal leads of the primary pulldown transistor element. A separate pulldown delay resistance element of selected value is coupled in series between the control terminal leads of the secondary and primary pulldown transistor elements. The secondary pulldown transistor element control terminal lead is coupled in the output buffer to receive a signal propagating through the output buffer before the primary pulldown transistor element control terminal lead. A relatively small discharge current is therefore limited from the output before turn on of the relatively large discharge current of the primary pulldown transistor element. The separate pulldown delay resistance element delays turn on of the primary pulldown transistor element a specified time delay after turn on of the secondary pulldown transistor element during transition from high to low potential at the output. As result ground bounce is divided into two spikes and the ground rise in potential is constrained to approximately one-half that of conventional ground bounce levels. A secondary pullup transistor element with associated noise reduction components can similarly be used on the supply side to reduce $V_{cc}$ droop.

24 Claims, 2 Drawing Sheets

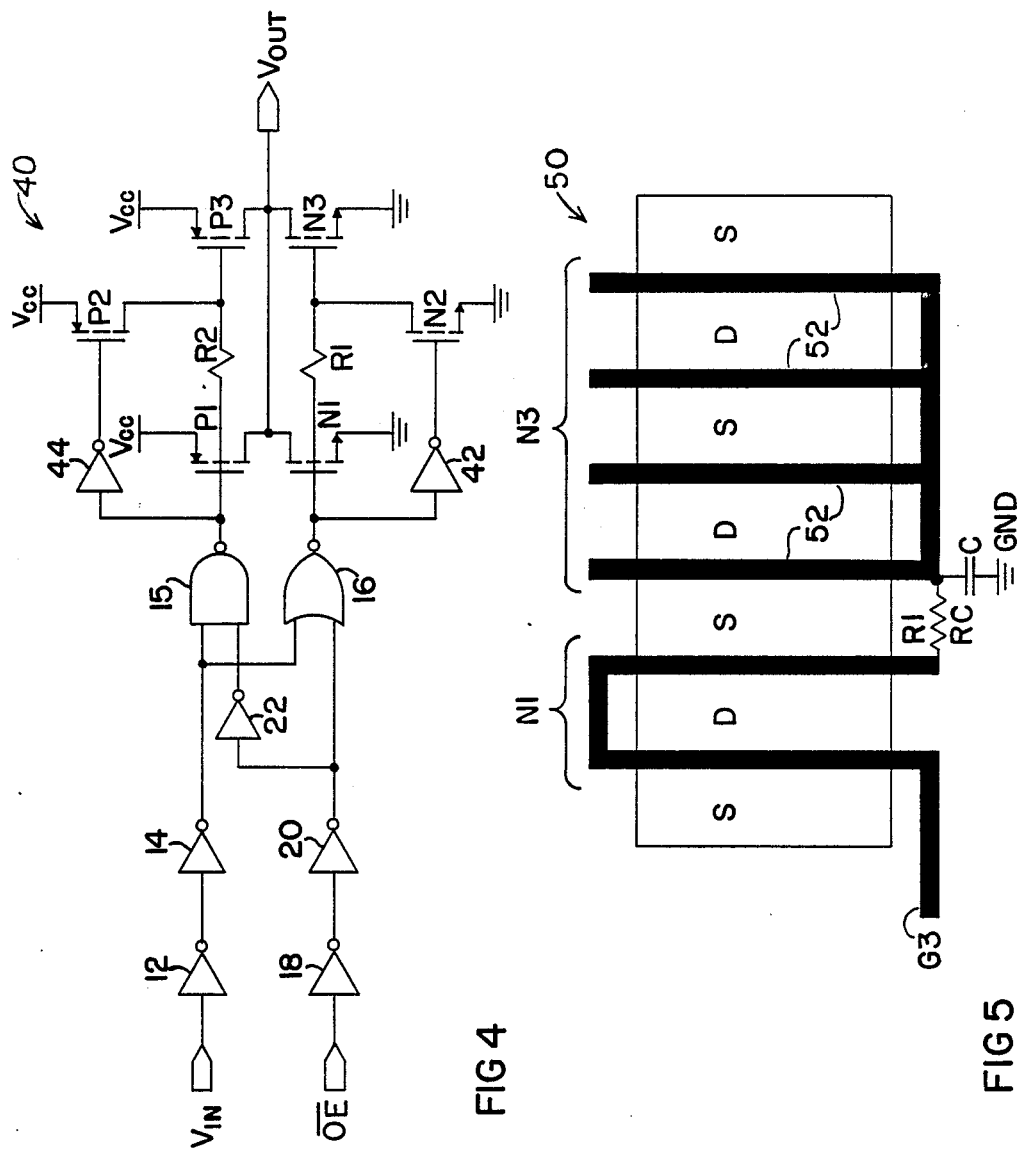

OUTPUT BUFFER FOR REDUCING SWITCHING INDUCED NOISE

TECHNICAL FIELD

This invention relates to a new output buffer for reducing switching induced noise in high speed digital integrated circuit devices. The invention reduces noise during high to low and low to high transitions at the loaded output of the device. The invention is particularly applicable for multiple output devices driving relatively large loads on a common bus. For example, the invention provides low noise output buffers for octal buffer line drivers.

BACKGROUND ART

The basic integrated circuit output buffer includes an input for receiving data signals of high and low potential, and an output for delivering data signals propagated through the output buffer. A relatively large current carrying capacity primary pulldown transistor element is coupled at the output for sinking a relatively large discharge current from the output to ground. A relatively large current carrying capacity primary pullup transistor element is coupled at the output for sourcing a relatively large charging current to the output from a power supply. Each transistor element is characterized by a sourcing or sinking primary current path between first and second terminal leads, and a third control terminal lead for controlling the conducting state of the primary current path.

Both MOS and bipolar integrated circuit output buffers and devices turn on the pulldown transistor element for discharging the output load capacitance and for sinking current from the output to external ground during transition from high to low potential at the output. The surge or acceleration of charge develops a voltage across the output ground lead inductance proportional to L di/dt resulting in a positive ground rise in potential or ground bounce in what should be a statically low output. This output ground bounce may typically be in the order of 0.5 to 2.5 volts above the external ground 0 volts for circuits with a power source $V_{cc}$ operating at 5 volts. Deceleration of the initial surge of sinking current charge through the pulldown transistor element develops another voltage across the output ground lead inductance causing a negative ground voltage undershoot of potential in the output lead of opposite polarity from the ground bounce. The absolute value of the output undershoot negative spike may be greater than the positive ground bounce spike.

Similarly both MOS and bipolar output circuits turn on the pullup transistor element for charging the output load capacitance and for sourcing current from a power supply to the output during transition from low to high potential at the output. The initial surge or acceleration of sourcing current charge develops a voltage across the output power supply lead inductance proportional to L di/dt resulting in a negative drop in the output supply voltage at the static high output lead. This drop in the output power supply voltage is referred to as supply voltage droop or $V_{cc}$ droop. Power supply voltage droop may be as great as for example 0.5 to 2.5 volts below the external supply voltage in circuits with a $V_{cc}$ power supply of 5 volts. Deceleration of the surge of sourcing current charge through the pullup transistor element develops another voltage across the output supply lead inductance causing a positive output supply voltage overshoot of potential in the output lead of opposite polarity from the $V_{cc}$ droop. The positive spike of the $V_{cc}$ overshoot above the external supply voltage may be as great as the absolute value of the negative spike of $V_{cc}$ droop in the output lead.

The disruptive effects of this noise on the output ground and supply leads include pulsing of noise on input and internal circuit ground and power supply lines; radio frequency radiation interference (RFI) and electromagnetic induction interference (EMI) noise which may interfere with a host system; local threshold shifts in the reference voltages for high and low potential data signals causing false data signals; and interference with other low or quiet outputs on a common bus. For example, a low output on an octal buffer line driver common bus may experience a rise with ground bounce causing a false high signal. These problems associated with output ground and supply noise are of increased concern in recent integrated circuits switch higher currents at higher speeds.

The phrase "transistor element" is used herein to refer to integrated circuit transistors from different IC technologies including MOS transistors such as NMOS, PMOS and CMOS transistor elements, and bipolar transistors including, for example, NPN and PNP transistor elements in TTL and ECL circuits. The transistor elements are generically characterized as having a primary current path with primary current path first and second terminal leads or electrodes, and a third control terminal lead or electrode for controlling the conducting state of the primary current path. In the case of an NMOS transistor element, for example, the primary current path first terminal lead is the drain lead, the second terminal lead is the source lead, and the third control terminal lead is the gate lead, etc. In the case of a bipolar NPN transistor element, the primary current path first terminal lead is the collector lead, the second terminal lead is the emitter lead, and the control terminal lead is the base lead, etc. In the case of PMOS and PNP transistor elements, the role of the first and second terminal leads are the inverse from that of the NMOS and NPN transistor elements respectively.

OBJECTS OF THE INVENTION

It is therefore an object of the present invention to provide new output buffers for reducing switching induced noise in high speed integrated circuits.

A particular object of the invention is to provide a controlled output buffer for reducing noise in the output ground and supply leads. The invention reduces both ground bounce and $V_{cc}$ droop, and ground undershoot and $V_{cc}$ overshoot, and is applicable for both MOS and bipolar technology integrated circuits.

A further object of the invention is to provide a method using separate and distinct circuit elements with component parameter values that may be flexibly selected or "programmed" in the wafer fabrication mask works for minimizing positive ground bounce spikes and negative $V_{cc}$ droop spikes, negative ground undershoot spikes and positive $V_{cc}$ overshoot spikes.

DISCLOSURE OF THE INVENTION

In order to accomplish these results the present invention improves upon the basic output buffer. According to the invention a relatively small current carrying capacity secondary pulldown transistor element is coupled with its current path first and second terminal leads in parallel with the current path first and second terminal leads of the primary pulldown transistor element. A separate pulldown delay resistance element of selected value is operatively coupled in series between the control terminal leads of the secondary and primary pulldown transistor elements.

The new secondary pulldown transistor element control terminal lead is coupled in the output buffer to receive a signal propagating through the output buffer before the primary pulldown transistor element control terminal lead. The secondary pulldown transistor element therefore initiates a relatively small discharge current from the output before turn on of the relatively large discharge current of the primary pulldown transistor element. The separate pulldown delay resistance element value is selected for turning on the primary pulldown transistor element a specified time constant delay after the secondary pulldown transistor element during transition from high to low potential at the output.

A feature of this arrangement of the invention is that the early turn on of a small current carrying capacity secondary pulldown transistor element initiates pulldown at the output and sinking of current from the output at only a small current sinking level. The initial sinking current level and the charge acceleration are constrained by the size and internal resistance of the small current carrying capacity transistor element. As a result the positive ground rise of potential proportional to L di/dt is also constrained to a lower level, typically less than one half that of a conventional output buffer.

The separate pulldown delay resistance element and the parasitic capacitance of the primary pulldown transistor element form an RC delay network which delays turn on of the primary or large current carrying capacity pulldown transistor element. This delay is determined by the selected resistance value of the pulldown delay resistance element and consequent time constant of the RC delay network. An advantage of this arrangement according to the invention is that the small secondary sinking current continues to discharge the charge stored in the output load capacitance during the time constant delay. Upon turn on of the primary large current carrying capacity pulldown transistor element a second positive ground rise of potential occurs. However, the second ground bounce is now also limited by the reduction in charge in the output load capacitance already effected by the early small secondary sinking current. The reduced sinking current level and charge level also constrains and limits subsequent ground undershoot.

As used in this specification, the phrase "separate components" or "separate component elements" and the word "separate" are intended to denote distinct component elements of an integrated circuit structure. In particular, the "separate" pulldown delay resistance element or resistor element is a separate and distinct IC component from the secondary pulldown transistor element and channel resistance in the case of an MOS secondary pulldown transistor element. The parameter values of the secondary pulldown transistor element and the separate pulldown delay resistance element may therefore be separately selected or "programmed" in the mask works used for IC chip wafer fabrication to achieve the objectives of the invention as hereafter described. For example, the parameter values of the separate component elements may be selected to give the desired RC network characteristics and to equalize the first and second component ground bounce "spikes" as hereafter further set forth.

According to the preferred embodiment of the invention, the ratio of current carrying capacities of the primary and secondary pulldown transistor elements and the value of the pulldown delay resistance element are selected to achieve the following objective. The first positive ground rise in potential (first ground bounce) caused by early turn on of the secondary pulldown transistor element, and the second positive ground rise in potential (second ground bounce) caused by later turn on of the primary pulldown transistor element are arranged to be substantially equal by the selection of parameter values. The invention therefore provides a new method and new IC structure for minimizing the positive ground bounce spike by dividing the ground bounce spike into two components. The two component spikes are equalized by adjusting the values of mask programmable separate components at the output. As a result, the two phase or two step turn on component ground spikes may be limited to a noise level typically less than half that of conventional output buffers.

The phrase "mask programmable" with reference to the separate IC components and elements at the buffer output is used in the following context. The various IC components are delineated in mask works used in IC chip wafer fabrication. According to the invention certain separate components such as the primary pulldown transistor element, secondary pulldown transistor element, and the pulldown delay resistor element have parameter values which may be flexibly selected for delineation in the mask works. The end user may specify the parameter values for these separate components according to the end use requirements and the requirements of the host circuit. For example, the channel width of primary and secondary pulldown transistor elements and the resistance of separate pulldown delay resistor elements may be flexibly specified or selected in the mask works according to well known techniques. It is in this respect that specified component parameter values particularly at the buffer output are "mask programmable" according to the application. That is, the separate component parameter values may be selected to achieve the objective of reducing ground bounce and $V_{cc}$ droop to approximately one half that of conventional levels.

In the preferred example embodiments the ratio of current carrying capacities of the primary to secondary pulldown transistor elements is at least approximately 4 to 1 with a discrete delay resistor having a value of for example 5K ohms to equalize and minimize the component first and second ground bounce spikes. Typically the ratio of current carrying capacities of the primary to secondary pulldown transistor elements is in the range of approximately 4/1 to 7/1. In the case of MOS transistor elements this is accomplished by setting the ratio of the channel widths of the primary to secondary pulldown transistor elements at approximately at least 4 to 1, and in the range of 4/1 to 7/1 etc.

In order to accelerate turn off of the primary pulldown transistor element during the reverse transition from low to high potential at the output, the invention provides a pulldown delay bypass transistor element having its current path first and second terminal leads coupled between the control terminal lead of the primary pulldown transistor element and ground. A pulldown delay bypass control circuit operatively couples the control terminal lead of the bypass transistor element to the control terminal lead of the secondary pulldown transistor element. This permits bypassing the pulldown delay resistance element for rapid turn off of the primary pulldown transistor element during transition from low to high potential at the output. Typically the control circuit incorporates an inverting element for applying the proper polarity signal to the control terminal lead of the bypass transistor element.

A feature of the invention is that the separate output component elements including the secondary pulldown transistor element, primary pulldown transistor element, and the delay resistance element are mask programmable or selectable to achieve the desired circuit parameters. In the case of MOS implementation the output transistor elements and the pulldown delay bypass transistor element are typically NMOS transistor elements and the delay resistor is a P+ diffused resistor programmable over a value range of for example near 0 to 5000 ohms.

The invention contemplates similar measures for reducing noise on the supply rail side of the output buffer. A relatively small current carrying capacity secondary pullup transistor element is coupled with its primary current path first and second terminal leads in parallel with the current path first and second terminal leads of the primary pullup transistor element. A separate pullup delay resistor element of selected resistance value is coupled in series between the control terminal leads of the secondary and primary pullup transistor elements.

In a similar manner the secondary pullup transistor element control terminal lead is coupled in the output buffer to receive a signal propagating through the output buffer before the primary pullup transistor element control terminal lead. The secondary pullup transistor element initiates a relatively small charging current from a power supply to the output before turn on of the relatively large charging current of the primary pullup transistor element during transition from low to high potential at the output. The discrete delay pullup resistor element resistance value is selected for turning on the primary pullup transistor element a specified time constant delay after the secondary pullup transistor element, as hereafter described.

The early turn on, small current carrying capacity, pullup transistor element initiates pullup at the output at only a small current sourcing level and with reduced charge acceleration, constrained by the size and small current carrying capacity of the pullup transistor element. As a result, the first $V_{cc}$ droop spike in the output supply lead is limited to a level typically less than half that of conventional output buffers. The initial early small sourcing current continues charging the output load capacitance during the pullup time delay of the pullup RC delay network. As a result, upon turn on of the primary pullup transistor element, the second $V_{cc}$ droop spike is also limited by the reduction of the charge required to complete charging and pullup of the output load capacitance to high potential.

The ratio of the current carrying capacities of the primary and secondary pullup transistor elements and the value of the pullup delay resistance element are selected to achieve the following objective. The first negative power droop in potential (first $V_{cc}$ droop) caused by early turn on of the secondary pullup transistor element, and the second negative power droop in potential (second $V_{cc}$ droop) caused by later turn on of the primary pulldown transistor element are arranged to be substantially equal by the selection of parameter values. In the preferred range the ratio of current carrying capacities of the primary to secondary pullup transistor elements is at least approximately 4 to 1 and preferably in the range of 4/1 to 7/1, with a separate delay resistor element having a value of for example one thousand ohms (1K ohms).

For rapid turn off of the pullup transistor element during the transition from high to low potential at the output, the invention provides a pullup delay bypass transistor element having its current path first and second terminal leads operatively coupled between the power supply and the control terminal lead of the primary pullup transistor element. A pullup delay bypass control circuit operatively couples the control terminal lead of the pullup delay bypass transistor element to the control terminal lead of the secondary pullup transistor element. This permits bypassing the pullup delay resistor element for rapidly turning off the primary pullup transistor element during transition from high to low potential at the output.

In the case of MOS implementation of the output buffer circuit, the primary and secondary pullup transistor elements and pullup delay bypass transistor elements may typically comprise PMOS transistor elements. An inverting element is incorporated in the pullup delay bypass transistor element control circuit for applying a signal of proper polarity to the control terminal lead of the bypass transistor element. The pullup delay resistor element is for example a P+ diffused resistor element programmable over a range of near 0 to 5000 ohms, and typically in the order of 1K ohms.

By way of comparison a conventional output buffer may experience a ground rise or ground bounce in the order of 0.5 to 2.5 volts above the external 0 volts ground potential. The characteristic propagation delay of a signal from the input to the output is, for example, 4 ns, operating into a standard load capacitance of, for example, 50 pf. Prior art methods for delaying turn on of the pulldown transistor element include control of the edge rate of the high to low transition. This may substantially reduce the ground bounce by 50% but only with substantial additional propagation delay, for example doubling the propagation delay from 4 ns to 8 ns, thereby degrading the switching speed by 50%.

According to the present invention the ground bounce or rising ground voltage may be constrained to one half the conventional value at a cost of increase in switching speed propagation delay of only approximately 1.5 ns. This compares favorably with the conventional increase in propagation delay of 3–4 ns. Thus a reduction in ground bounce of 1 to 1.5 volts is accompanied by a degradation in switching speed of only 1.5 ns beyond the typical characteristic propagation delay of 4 ns. The invention thus provides a substantial improvement in the tradeoff of speed degradation for noise reduction.

In effect, by dividing each of the pullup and pulldown transistor elements into an early small current capacity secondary and later large current capacity primary, the invention effectively provides an unequal active voltage divider on each of the low and high potential sides of the output. A delay network between the active "branches" of each voltage divider results in delay in turn on of the unequal branches of each voltage divider. As a result either sinking current through the pulldown voltage divider or sourcing current through the pullup voltage divider is initiated in two steps or phases. An early smaller current flows through one branch and a later larger current flows through the other branch of the respective voltage divider.

Other objects, features and advantages of the invention are apparent in the following specification and accompanying drawings.

BRIEF DESCRIPTION OF THE DRAWINGS

FIG. 4 is a schematic circuit diagram of an output buffer for reducing switching induced noise according to the invention.

FIG. 5 is a simplified diagrammatic plan view of the separate programmable output pulldown components for the output buffer including the secondary pulldown transistor element, pulldown delay resistor element, and primary pulldown transistor element.

DESCRIPTION OF PREFERRED EXAMPLE EMBODIMENTS AND BEST MODE OF THE INVENTION

Figure 1:
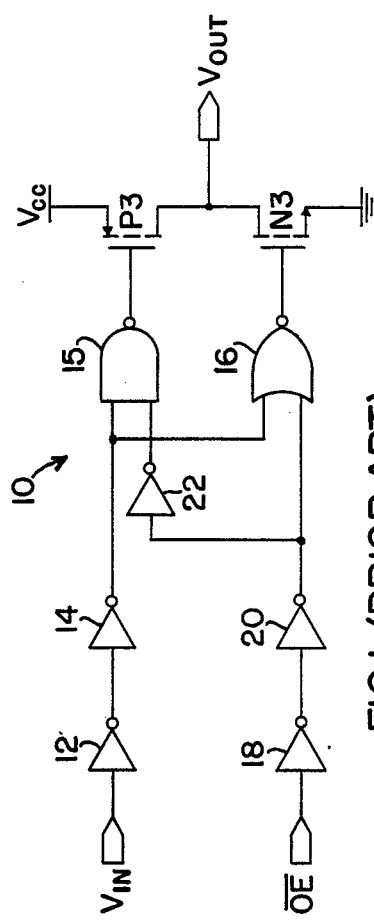
FIG. 1 is a schematic circuit diagram of a prior art MOS output buffer.

A conventional prior art MOS transistor output buffer 10 is illustrated FIG. 1. Multiple output buffers of this type may be incorporated, for example, as output buffers in an octal buffer line driver. The pulldown transistor element is provided by the relatively large current carrying capacity NMOS transistor N3. The pullup transistor element is provided by relatively large current carrying capacity PMOS transistor element P3. Output buffer 10 is a non-inverting tristate output device, and data signals propagate from the input $V_{IN}$ to the output $V_{OUT}$. The tristate output enable and disable signals are applied at the OE terminal input.

A data signal at the input $V_{IN}$ passes through two inverting current amplification stages 12, 14 and then is applied at the same polarity as the input to NAND gate 15 and NOR gate 16. NAND gate 15 drives pullup transistor element P3. NOR gate 16 drives the pulldown transistor element N3. The second input to each of the gates 15, 16 is derived from the $\overline{OE}$ terminal input.

An output enable signal OE is applied in inverted polarity $\overline{OE}$ at the tristate $\overline{OE}$ terminal. This tristate signal passes through first and second inverting current amplification stages 18, 20 and is applied at the same polarity as the $\overline{OE}$ signal to the input of NOR gate 16. The tristate signal also passes through first and second inverting stages of current amplification 18, 20 and a third inverter stage 22 before it is applied to the input of NAND gate 15. The tristate signal applied to the input of NAND gate 15 is thus of opposite polarity from the $\overline{OE}$ signal and is in phase with output enable signal OE.

The logic gate arrangement of the output buffer 10 of FIG. 1 delivers output data signals of high and low potential at the output $V_{OUT}$ in phase with data signals at the input $V_{IN}$ during bistate operation when the output enable signal OE is high ($\overline{OE}$ low). When the OE signal is low ($\overline{OE}$ high) during the high impedance third state, both the pullup transistor element P3 and the pulldown transistor element N3 are disabled. The output $V_{OUT}$ appears as a high impedance to other output buffers on a common bus.

Figure 2:
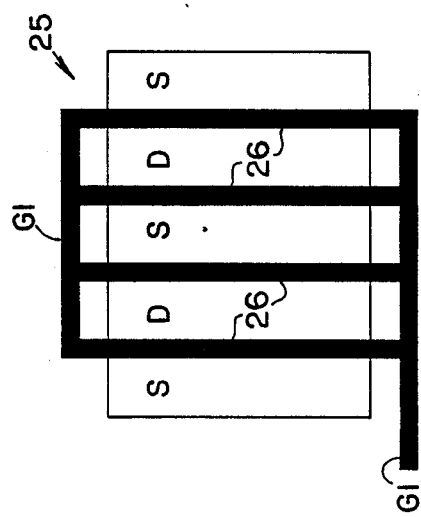
FIG. 2 is a simplified diagrammatic plan view of a conventional MOS pulldown transistor element layout showing four NMOS transistor sections or lengths in an array with the gates operating simultaneously in parallel.

A prior art MOS transistor element 25 for implementing the output transistors N3 and P3 is illustrated in FIG. 2. The MOS transistor is fabricated with alternating spaced apart source and drain regions respectively designated S and D in FIG. 2. The source S and drain D regions are formed of semiconductor material of the same polarity diffused or implanted in a semiconductor substrate of opposite polarity. Thus, the source S and drain D regions of one polarity are spaced apart and separated by a narrow channel of semiconductor material of opposite polarity. An insulating layer such as an oxide layer is formed over the source and drain regions and separating channels. Conductive strips 26 of, for example, polysilicon or metal are deposited over the channels separating the multiple source and drain regions, overlapping the respective source and drain regions to provide a gate. Multiple transistor element sections are therefore provided. In the example of FIG. 2 the conductive strips or lengths 26 of the gate are coupled together in parallel. As a result all of the strips or lengths 26 of the gate G1 effectively operate simultaneously for controlling the conducting state between the multiple source and drain regions.

In the case of an NMOS transistor element or N-channel enhancement type field effect transistor, source and drain N-type regions are diffused or implanted in the surface of a P-type silicon substrate. In such an N-channel enhancement type field effect transistor, a positive or high level signal on the gate G1 causes a layer of N-type carriers to form in the P-channel separating the source and drain regions. The transistor element therefore becomes conducting through the primary current path between the source S and drain D regions.

In the case of a PMOS transistor element or P-channel enhancement type field effect transistor, the source S and drain D regions are P-type regions diffused or implanted in an N-type silicon substrate. The separating channels are therefore formed of N-type silicon material. In the case of a PMOS transistor element a negative or low level signal applied to the gate G1 causes a layer of P-type carriers to form in the separating N channel. As a result the PMOS transistor becomes conducting through its primary current path between the sources and drain D regions upon application of the negative or low level signal to the gate G1.

Figure 3:
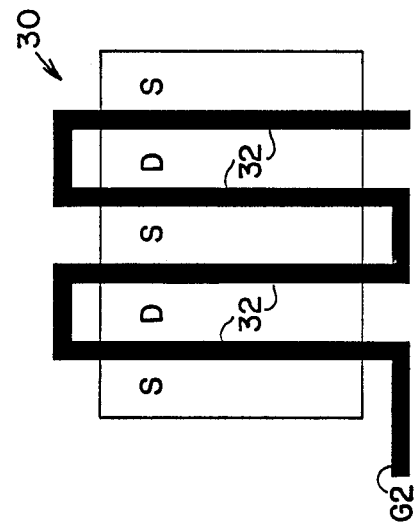
FIG. 3 is a simplified diagrammatic plan view of a prior art distributed MOS pulldown transistor element with the gates of four distributed NMOS transistor sections coupled in series forming a delay line operating sequentially.

A conventional MOS output buffer incorporating MOS output transistors of the type illustrated in FIG. 2 are typically characterized by a propagation delay from input to output of, for example, 4 ns. Switching of the output transistors of FIG. 2 is accompanied by the problems of ground bounce and $V_{cc}$ droop discussed under the Background Art section. As a result, distributed or serpentine MOS transistor configurations of the type illustrated in FIG. 3 have been used for the output transistors in order to reduce ground bounce and $V_{cc}$ droop by slowing the inherent switching speed of the output transistors. In the prior art example of FIG. 3, the gate G2 of MOS transistor 30 is formed by gate strips or lengths 32 coupled in series rather than in parallel. The MOS transistor element 30 is a true distributed transistor element with effectively four transistor element sections associated with the respective gate strips or lengths 32 coupled in series. The gate G2 operates as a transmission line or delay line with propagation delay through the successive transistor element sections. The problem with this conventional distributed MOS output transistor element is the inherent delay in switching speed which typically adds a further propagation delay of 4 ns to 6 ns to the output buffer.

An improved output buffer circuit 40 according to the invention is illustrated in FIG. 4. Integrated circuit elements and components which are the same as the output buffer 10 of FIG. 1 are indicated by the same reference numerals or reference designations. In addition to these common circuit components and elements, the improved output buffer circuit 40 includes a relatively small current carrying capacity secondary pullup transistor element, PMOS transistor P1. The relatively small current carrying capacity secondary pulldown transistor element is provided by NMOS transistor N1. As heretofore described the ratio of current carrying capacities of the primary pulldown transistor element N3 to the secondary pulldown transistor element N1 is preferably at least 4 to 1 or greater and typically in the range of 4/1 to 7/1. The same ratio of current carrying capacities is used for the primary to secondary pullup transistor elements.

In the case of MOS transistors, the current carrying capacity is a function, among other things, of the channel resistance of the MOS transistors. The channel resistance in turn depends on the geometry of the channel. For example, the channel resistance can be reduced by decreasing the length of the distance across the channel between the source and drain regions. If this distance is fixed, the channel resistance can also be reduced by increasing the channel width along the interacting sides of the source and drain regions. Thus, current carrying capacity is proportional to channel width.

By way of example, the primary output transistor elements, that is primary pulldown transistor element N3 and primary pullup transistor P3 may be formed with a channel width of, for example, 688 $\mu$ (microns). The secondary output transistors, that is the secondary pullup transistor element P1 and secondary pulldown transistor element N1 may be formed with a channel width of 160 $\mu$. With the same channel length or distance between source S and drain D regions of, for example, 1.6 $\mu$ the ratio of channel widths and therefore current carrying capacities of the primary output transistors to the secondary output transistors is approximately 4.3 to 1, slightly greater than 4 to 1.

In the case of bipolar circuits such as TTL output devices with NPN output transistors, the ratio of current carrying capacities for example between the primary and secondary pulldown transistor elements is controlled by collector resistors and base resistors. Thus the ratio of current carrying capacities is adjusted within the preferred range by selection of the base drive resistors and the collector resistors. The later turn on large current carrying capacity primary pulldown transistor element is provided with a smaller base drive resistor and smaller collector resistor to achieve large base drive and large collector current. The early turn on small current capacity secondary pulldown transistor element is provided with a relatively large base drive resistor for smaller base drive current to limit the collector current. In the case of a bipolar TTL output circuit implementation, either or both of the primary and secondary output transistor elements may be provided by a Darlington pair of transistor elements.

Returning to FIG. 4, the time constant delay between early turn on of the secondary pulldown transistor element N1 and the primary pulldown transistor element N3 is provided by the separate resistor or resistance element R1 coupled between the control terminal leads of the secondary and primary pulldown transistor elements N1 and N3. In the circuit of FIG. 4 the resistance value of separate resistor R1 is selected to be for example 5K ohms. Resistor R1 cooperates with the inherent input gate oxide capacitance of pulldown transistor N3 to form an RC network with a time constant delay of for example 1 to 5 ns.

Similarly on the supply side, separate resistor element R2 is coupled between the control terminal leads or gates of secondary and primary pullup transistor elements P1 and P3. Resistor R2 is typically selected to have a value of for example 1000 ohms cooperating with the larger output capacitance of primary pullup element P3 to provide the desired RC time constant delay between the early turn on of secondary pullup transistor P1 and the later turn on of primary pullup transistor element P3.

With sinking and sourcing currents in the order of 24 ma, the parameters in the foregoing examples are selected for sequential turn on of the secondary and primary output transistors with an increase in propagation delay of only, for example, 1.5 ns operating into a standard output load capacitance of 50 pf. For operating into larger output capacitances, the delay of course increases. As a rule of thumb a given propagation delay into an output load capacitance of 50 pf doubles into a larger output load capacitance of 300 pf, and doubles again into an output load capacitance of 1000 pf. In the foregoing example however, operating into a standard load capacitance of 50 pf, the additional delay of 1.5 ns introduced by the small current carrying capacity secondary output transistor element and separate delay resistor on top of the basic output buffer propagation delay of 4 ns gives a total propagation delay of 5.5 ns. This compares favorably with the total propagation delay of for example 8 to 10 ns accompanying a conventional distributed or serpentine output transistor element of the type illustrated in FIG. 3.

Referring to the pulldown transistor element N3, the intentional delay introduced by the two step or two phase turn on of the secondary pulldown transistor element N1 and the primary pulldown transistor element N3, separated by the separate gate resistor R1 and effective RC network, reduces the ground rise in potential or ground bounce by 50%. In order to prevent an RC network delay in the turn off of the large current carrying capacity pulldown transistor element N3 during switching from low to high potential at the output, a bypass circuit is provided for bypassing resistor element R1 and the effective RC network. The delay bypass circuit for turning off the pulldown transistor N3 is provided by NMOS bypass transistor N2 and MOS inverter 42. The inverter is coupled to the control terminal or gate of the secondary transistor element N1 for bypassing a signal propagating through the output buffer, directly to the control terminal or gate of primary pulldown transistor N3 through the inverter 42 and bypass transistor N2.

The output buffer circuit 40 is a noninverting buffer. When the data input signal at input $V_{IN}$ switches from low to high potential, the data signal propagating through the logic gates is of low potential or logic low level when it reaches the gate of secondary pulldown transistor N1. Inverter 42 inverts this signal to high potential or logic high level so that bypass transistor N2 is conducting, rapidly draining the gate and turning off the primary pulldown transistor N3. In this manner the secondary pulldown transistor element N1, delay resistor R1 and effective RC network are bypassed for rapid turn off of the primary pulldown transistor element N3 and rapid switching at the output $V_{OUT}$ from low to high potential. Of course, during transitions from high to low potential at the output, the bypass circuit is inoperative, and bypass transistor N2 is off.

Similarly on the supply side of the output buffer 40 a pullup delay bypass circuit is provided from the gate of secondary pullup transistor P1 directly to the gate of the relatively large current carrying capacity primary pullup transistor P3. This supply delay bypass circuit includes the pullup delay PMOS bypass transistor P2 and inverter 44. The supply delay bypass circuit elements P2 and 44 operate in the same manner as the pulldown delay bypass circuit elements N2 and 42, one being a "mirror image" of the other.

In the circuit of FIG. 4 secondary output transistors and associated noise reduction circuits are described for both the pulldown and pullup transistor elements on the ground side and supply side respectively. It is apparent, according to the invention however that either secondary output transistor element and associated noise reduction circuitry may be provided on either the ground side or supply side alone. Ground noise is typically of greater concern and an MOS output buffer might typically be provided with the additional noise reduction components N1, R1, N2 and 42 on the ground side alone without the added supply side components P1, R2, P2 and 44.

A distributed transistor element for implementing the secondary and primary output transistor elements, for example secondary and primary pulldown transistor elements N1 and N3, along with delay resistor R1, is illustrated in FIG. 5. In this composite transistor element configuration or layout 50 the large current carrying capacity primary pulldown transistor N3 taken alone is similar to the transistor element 25 of FIG. 2. Thus the large channel width, large current carrying capacity transistor N3 includes multiple transistor sections with gate sections or lengths 52 coupled in parallel. However the gate line G3 which controls the conducting state of primary pulldown transistor element N3 first passes along the smaller channel width and smaller current carrying capacity secondary pulldown transistor N1. The conductive line of gate G3 after passing along secondary transistor element N1 passes through the delay resistor R1 which may be a diffused or implanted resistor such as a P+ diffused resistor. The resistor R1 in combination with the capacitance of primary pulldown transistor N3 indicated by the equivalent circuit capacitor C of FIG. 4 forms the RC delay network and RC time constant delay between early turn on of secondary pulldown transistor N1 and later turn on of the primary pulldown transistor element N3.

In fabricating the output buffer with reduced switching induced noise, the separate components are appropriately delineated in the masks for wafer fabrication. The delay resistance R1 may be provided by a segment of a serpentine transistor appropriated for separate use as a separate resistor element with selected resistance value. A flexible layout can be provided on the mask works for flexible selection of the separate parameter values according to the circuit requirements and applications. Over all the parameters are selected to achieve the objective of the invention of equalizing the first and second ground bounce between early and later turn on of the respective secondary and primary pulldown transistor elements, or equalizing first and second $V_{cc}$ droop, to reduce switching induced ground and supply rail noise by a factor of substantially one half.

While the invention has been described with reference to particular example embodiments it is intended to cover all variations and modifications within the scope of the following claims.

I claim:

1. An output buffer for reducing switching induced noise in high speed integrated circuit devices, said output buffer having an input for receiving data signals of high and low potential, an output for delivering data signals propagated through the output buffer, a relatively large current carrying capacity primary pulldown transistor element operatively coupled at the output for sinking a relatively large discharge current from the output to ground, and a relatively large current carrying capacity primary pullup transistor element operatively coupled at the output for sourcing a relatively large charging current to the output from a power supply, each transistor element being characterized by a sourcing or sinking current path between first and second terminal leads, and a third control terminal lead for controlling the conducting state of the current path, the improvement comprising:

a relatively small current carrying capacity secondary pulldown transistor element having its current path first and second terminal leads coupled in parallel with the current path first and second terminal leads of the primary pulldown transistor element;

and a separate pulldown delay resistor component element of selected resistance value operatively coupled in series between the control terminal leads of the secondary and primary pulldown transistor elements for turn on of the primary pulldown transistor element a specified time delay after the secondary pulldown transistor element during transition from high to low potential at the output;

said secondary pulldown transistor element control terminal lead being coupled in the output buffer to receive a signal propagating through the output buffer before the primary pulldown transistor element control terminal lead to initiate a relatively small discharge current from the output before turn on of the relatively large discharge current of the primary pulldown transistor element;

the ratio of current carrying capacities of the primary and secondary pulldown transistor elements and the resistance value of the pulldown delay resistor component element being selected so that the first positive ground rise in potential (first ground bounce) caused by turn on of the secondary pulldown transistor element and the second positive ground rise in potential (second ground bounce) caused by turn on of the primary pulldown transistor element, are substantially equal.

2. The output buffer of claim 1 wherein the primary and secondary pulldown transistor elements comprise MOS transistor elements.

3. The output of claim 2 wherein the ratio of current carrying capacities of the primary to secondary pulldown transistor elements is at least approximately 4/1.

4. The output buffer of claim 3 wherein the ratio of current carrying capacities of the primary to secondary pulldown transistor elements is in the range of approximately 4/1 to 7/1.

5. The output buffer of claim 1 further comprising a pulldown delay bypass transistor element having its current path first and second terminal leads coupled between the control terminal lead of the primary pulldown transistor element and ground, and a pulldown delay bypass control circuit operatively coupling the control terminal lead of the bypass transistor element to the control terminal lead of the secondary pulldown transistor element bypassing the pulldown delay resistor component element for rapidly turning off the primary pulldown transistor element during transition from low to high potential at the output.

6. The output buffer of claim 5 wherein the transistor elements comprise MOS transistor elements, wherein the primary and secondary pulldown transistor elements and bypass transistor element comprise NMOS transistor elements, and wherein the pulldown delay bypass control circuit of the bypass transistor element incorporates an inverter.

7. The output buffer of claim 1 wherein the pulldown delay resistor component element comprises a diffused resistor element.

8. The output buffer of claim 6 wherein the pulldown delay resistor component element comprises a P+ diffused resistor element.

9. The output buffer of claim 1 further comprising:
a relatively small current carrying capacity secondary pullup transistor element having its primary current path first and second terminal leads coupled in parallel with the current path first and second terminal leads of the primary pullup transistor element;
and a separate pullup delay resistor component element of selected resistance value operatively coupled in series between the control terminal leads of the secondary and primary pullup transistor elements for turn on of the primary pullup transistor element a specified time delay after the secondary pullup transistor element during transition from low to high potential at the output;
said secondary pullup transistor element control terminal lead being coupled in the output buffer to receive a signal propagating through the output buffer before the primary pullup transistor element control terminal lead to initiate a relatively small charging current from a power supply to the output before turn on of the relatively large charging current of the primary pullup transistor element during transition from low to high potential at the output;
the ratio of current carrying capacities of the primary and secondary pullup transistor elements and the resistance value of the pullup delay resistor component element being selected so that the first negative power droop in potential (first $V_{cc}$ droop) caused by turn on of the secondary pullup transistor element and the second negative power droop in potential (second $V_{cc}$ droop) caused by turn on of the primary pulldown transistor element are substantially equal.

10. The output buffer of claim 9 wherein the primary and secondary pullup transistor elements are MOS transistor elements.

11. The output buffer of claim 10 wherein the ratio of current carrying capacities of the primary to secondary pullup transistor elements is at least approximately 4/1.

12. The output buffer of claim 10 wherein the ratio of current carrying capacities of the primary to secondary pullup transistor elements is in the range of approximately 4/1 to 7/1.

13. The output buffer of claim 9 wherein the separate pullup delay resistor component element is a diffused resistor element.

14. The output buffer of claim 9 further comprising a pullup delay bypass transistor element having its current path first and second terminal leads operatively coupled between the power supply and the control terminal lead of the primary pullup transistor element, and further comprising a pullup delay bypass control circuit operatively coupling the control terminal lead of the pullup delay bypass transistor element to the control terminal lead of the secondary pullup transistor element bypassing the pullup delay resistor component element for rapidly turning off the primary pullup transistor element during transition from high to low potential at the output.

15. The output buffer of claim 14 wherein the transistor elements comprise MOS transistor elements.

16. The output buffer of claim 15 wherein the primary and secondary pullup transistor elements and pullup delay bypass transistor element comprise PMOS transistor elements and wherein the pullup delay bypass control circuit comprises an inverting element.

17. The output buffer of claim 16 wherein the pullup delay resistor component element comprises a P+ diffused resistor element.

18. An output buffer for reducing switching induced noise in high speed integrated circuit devices, said output buffer having an input for receiving data signals of high and low potential, an output for delivering data signals propagated through the output buffer, a relatively large current carrying capacity primary pulldown transistor element operatively coupled at the output for sinking a relatively large discharge current from the output to ground, and a relatively large current carrying capacity primary pullup transistor element operatively coupled at the output for sourcing a relatively large charging current to the output from a power supply, each transistor element being characterized by a sourcing or sinking current path between first and second terminal leads and a third control terminal lead for controlling the current, the improvement comprising:
a relatively small current carrying capacity secondary pulldown transistor element having its current path first and second terminal leads coupled in parallel with the current path first and second terminal leads of the primary pulldown transistor element;
a discrete pulldown delay resistance element of selected value operatively coupled in series between the control terminal leads of the secondary and primary pulldown transistor elements;
said secondary pulldown transistor element control terminal lead being coupled in the output buffer to receive a signal propagating through the output buffer before the primary pulldown transistor element control terminal lead to initiate a relatively small discharge current from the output before turn on of the relatively large discharge current of the primary pulldown transistor element;
said discrete pulldown delay resistance element value being selected for turning on the primary pulldown transistor element a specified time delay after the secondary pulldown transistor element during transition from high to low potential at the output;

a pulldown delay bypass transistor element having its current path first and second terminal leads coupled between the control terminal lead of the primary pulldown transistor element and ground, and a pulldown delay bypass control circuit operatively coupling the control terminal lead of the bypass transistor element to the control terminal lead of the secondary pulldown transistor element bypassing the discrete pulldown delay resistance element for rapidly turning off the primary pulldown transistor element during transition from low to high potential at the output;

the ratio of current carrying capacities of the primary and secondary pulldown transistor elements and the value of the pulldown delay resistance element being selected so that the first positive ground rise in potential (first ground bounce) caused by turn on of the secondary pulldown transistor element and the second positive ground rise in potential (second ground bounce) caused by turn on of the primary pulldown transistor element, are substantially equal.

19. The output buffer of claim 18 wherein the transistor elements comprise MOS transistor elements, wherein the primary and secondary pulldown transistor elements and pulldown delay bypass transistor element comprise NMOS transistor elements, and wherein the control circuit of the bypass transistor element incorporates an inverter.

20. The output buffer of claim 19 wherein the discrete pulldown delay resistance element comprises a mask programmable P+ diffused resistor.

21. An output buffer for reducing switching induced noise in high speed integrated circuit devices, said output buffer having an input for receiving data signals of high and low potential, an output for delivering data signals propagated through the output buffer, a relatively large current carrying capacity primary pulldown transistor element operatively coupled at the output for sinking a relatively large discharge current from the output to ground, and a relatively large current carrying capacity primary pullup transistor element operatively coupled at the output for sourcing a relatively large charging current to the output from a power supply, each transistor element being characterized by a sourcing or sinking current path between first and second terminal leads, and a third control terminal lead for controlling the current, the improvement comprising:

a relatively small current carrying capacity secondary pullup transistor element having its primary current path first and second terminal leads coupled in parallel with the current path first and second terminal leads of the primary pullup transistor element;

and a discrete pullup delay resistor component element of selected resistance value operatively coupled in series between the control terminal leads of the secondary and primary pullup transistor elements;

said secondary pullup transistor element control terminal lead being coupled in the output buffer to receive a signal propagating through the output buffer before the primary pullup transistor element control terminal lead to initiate a relatively small charging current from a power supply to the output before turn on of the relatively large charging current of the primary pullup transistor element during transition from low to high potential at the output;

said discrete pullup delay resistor component element resistance value being selected for turning on the primary pullup transistor element a specified time delay after the secondary pullup transistor element during transition from low to high potential at the output;

the ratio of current carrying capacities of the primary and secondary pullup transistor elements and the resistance value of the pullup delay resistor component element being selected so that the first negative power droop in potential (first $V_{cc}$ droop) caused by turn on of the secondary pullup transistor element and the second negative power droop in potential (second $V_{cc}$ droop) caused by turn on of the primary pulldown transistor element are substantially equal.

22. The output buffer of claim 21 further comprising:

a pullup delay bypass transistor element having its current path first and second terminal leads operatively coupled between the power supply and the control terminal lead of the primary pullup transistor element, and further comprising a pullup delay bypass control circuit operatively coupling the control terminal lead of the pullup delay bypass transistor element to the control terminal lead of the secondary pullup transistor element bypassing the discrete pullup delay resistor component element for rapidly turning off the primary pullup transistor element during transition from high to low potential at the output.

23. The output buffer of claim 22 wherein the transistor elements comprise MOS transistor elements, wherein the primary and secondary pullup transistor elements and pullup delay bypass transistor element comprise PMOS transistor elements, and wherein the pullup delay bypass control circuit of the pullup delay bypass transistor element incorporates and inverting element.

24. The output buffer of claim 23 wherein the pullup delay resistor component element comprises a mask programmable P+ diffused resistor.

* * * * *